(12) United States Patent
Sartore

(10) Patent No.: US 8,200,929 B1
(45) Date of Patent: *Jun. 12, 2012

(54) HYBRID NONVOLATILE RAM

(75) Inventor: Ronald H Sartore, Poway, CA (US)

(73) Assignee: Agiga Tech Inc, San Diego, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 13/287,898

(22) Filed: Nov. 2, 2011

Related U.S. Application Data

(63) Continuation of application No. 11/881,346, filed on Jul. 25, 2007, now Pat. No. 8,074,034.

(51) Int. Cl.
*G06F 12/00* (2006.01)
*G06F 13/00* (2006.01)
*G06F 13/28* (2006.01)
*G06F 11/00* (2006.01)

(52) U.S. Cl. ............. 711/162; 711/119; 714/14; 714/24

(58) Field of Classification Search .................. 711/119, 711/162; 714/14, 24
See application file for complete search history.

(56) References Cited

U.S. PATENT DOCUMENTS

| | | | |
|---|---|---|---|
| 6,295,577 B1* | 9/2001 | Anderson et al. | 711/113 |
| 6,336,174 B1* | 1/2002 | Li et al. | 711/162 |
| 2004/0158674 A1* | 8/2004 | Cloutier et al. | 711/115 |
| 2006/0072369 A1* | 4/2006 | Madter et al. | 365/232 |
| 2006/0198198 A1* | 9/2006 | Fujita et al. | 365/185.23 |
| 2006/0212651 A1* | 9/2006 | Ashmore | 711/113 |
| 2007/0276995 A1* | 11/2007 | Caulkins et al. | 711/113 |
| 2008/0046638 A1* | 2/2008 | Maheshwari et al. | 711/103 |

* cited by examiner

*Primary Examiner* — Jared Rutz
*Assistant Examiner* — Ryan Bertram
(74) *Attorney, Agent, or Firm* — FSP LLC

(57) ABSTRACT

A memory subsystem includes a volatile memory, a nonvolatile memory, and a controller including logic to interface the volatile memory to an external system. The volatile memory is addressable for reading and writing by the external system. The memory subsystem includes a power controller with logic to detect when power from the external system to at least one of the volatile and nonvolatile memories and to the controller fails. When external system power fails, backup power is provided to at least one of the volatile and nonvolatile memories and to the controller for long enough to enable the controller to back up data from the volatile memory to the nonvolatile memory.

4 Claims, 12 Drawing Sheets

HYBRID NONVOLATILE RAM

This application claims priority under 35 U.S.C. 120 as a CONTINUATION of U.S. application Ser. No. 11/881,346 filed on Jul. 25, 2007, and incorporated herein by reference in its entirety.

TECHNICAL FIELD

The present disclosure relates to hybrid memory systems including volatile and nonvolatile memory components, and to monolithic nonvolatile memories that require stored energy in a capacitor or temporary use of a battery to perform a save operation upon power loss.

BACKGROUND

There are many computing applications that may benefit from the use of fast nonvolatile memory. These include disk caches, solid-state drives, hard disk emulation, hybrid drives, and file systems.

For example, popular PC file systems based on FAT (File Allocation Tables) and NTFS (New Technology File System) have frequently written file management data associated with the storage of the files. This is called "metadata"—the data that manages the file system. For a FAT32 and FAT16 based file system this is termed "FAT", for a NTFS file system this is called MFT (Master File Table).

Accurate metadata is essential to the operation of the file system. File systems might save their metadata on one or multiple (for redundancy) disk files. However, the importance of the metadata, the frequency of metadata access and alteration, and the need for speed when accessing or altering metadata, make metadata well suited for storage in a nonvolatile RAM instead of slower disk files (or wear-sensitive NAND Flash devices), and/or as a disk cache for file system operations.

A traditional block or page accessed nonvolatile RAM such as a limited endurance (Erase Write cycling) Multi Level Cell (MLC) NAND flash device may be used to store frequently accessed data. However, directly reading and writing a NAND flash device for applications involving frequent memory operations may prove slow and cumbersome, due to the non-RAM (e.g. block-sequential) access methods typically associated with such devices. The frequently-altered nature of data in such applications may cause premature memory system failure because NAND flash devices have limited erase/write capabilities before they may wear out and become unreliable. This may result in unreliable system operation and may ultimately necessitate the replacement of the NAND flash. More frequent NAND flash replacement may greatly increase the life-cycle cost of the system.

BRIEF DESCRIPTION OF THE DRAWINGS

In the drawings, the same reference numbers and acronyms identify elements or acts with the same or similar functionality for ease of understanding and convenience. To easily identify the discussion of any particular element or act, the most significant digit or digits in a reference number refer to the figure number in which that element is first introduced.

DETAILED DESCRIPTION

References to "one embodiment" or "an embodiment" do not necessarily refer to the same embodiment, although they may.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, refer to this application as a whole and not to any particular portions of this application. When the claims use the word "or" in reference to a list of two or more items, that word covers all of the following interpretations of the word: any of the items in the list, all of the items in the list and any combination of the items in the list.

"Logic" refers to signals and/or information that may be applied to influence the operation of a device. Software, hardware, and firmware are examples of logic. Hardware logic may be embodied in circuits. In general, logic may comprise combinations of software, hardware, and/or firmware.

Those skilled in the art will appreciate that logic may be distributed throughout one or more devices, and/or may be comprised of combinations of instructions in memory, processing capability, circuits, and so on. Therefore, in the interest of clarity and correctness logic may not always be distinctly illustrated in drawings of devices and systems, although it is inherently present therein.

Hybrid Memory Subsystem

Figure 1:
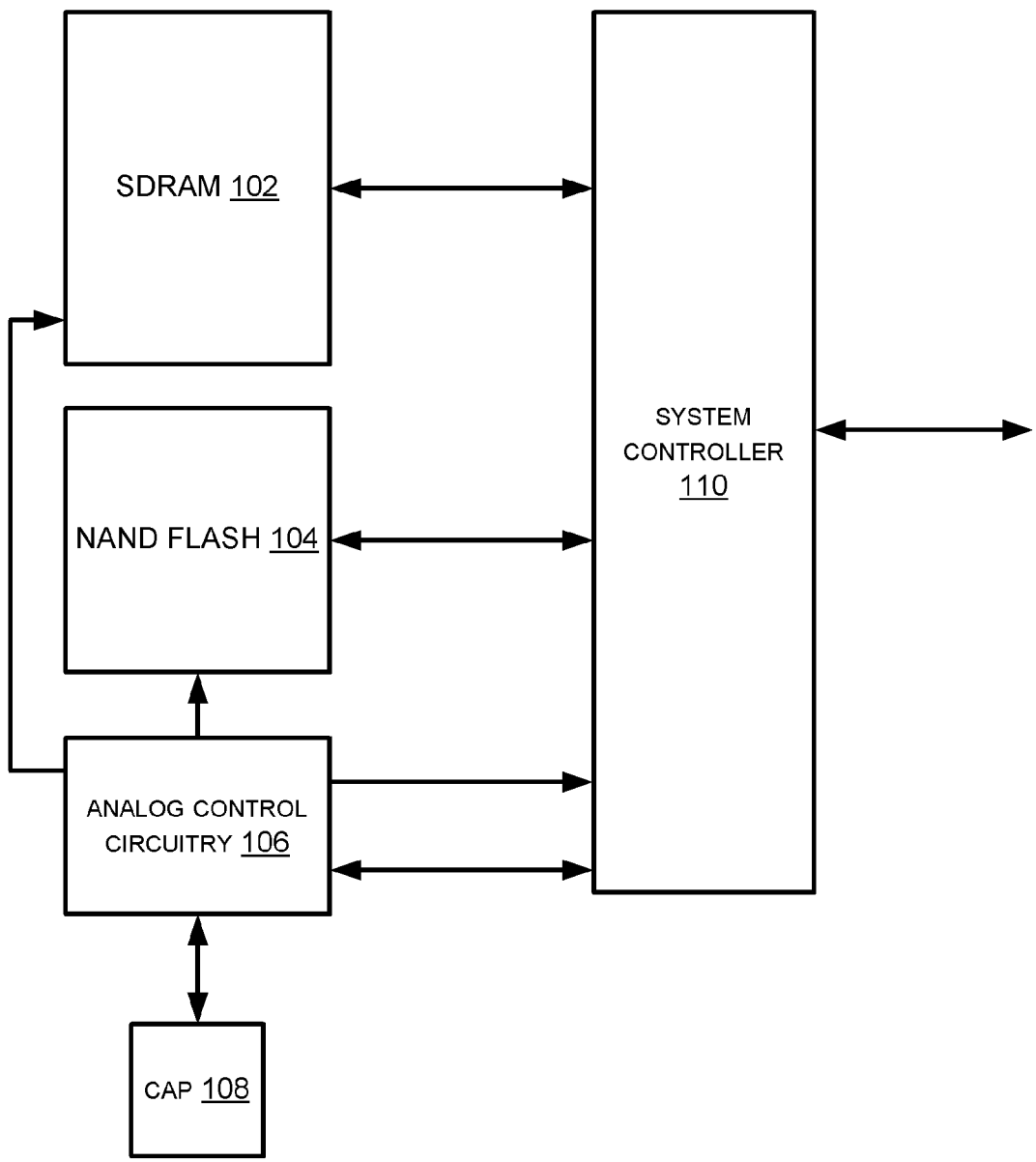
FIG. 1 is a block diagram of an embodiment of a hybrid memory subsystem.

FIG. 1 is a block diagram of an embodiment of a hybrid memory subsystem. The subsystem provides a low-cost, high density, non-volatile memory by using a low-cost volatile memory 102 in conjunction with a low-cost non-volatile memory 104.

The memory subsystem includes, but may not be limited to, SDRAM 102 (volatile memory), NAND FLASH 104

(nonvolatile memory), analog power control circuitry 106, power capacitor 108, and a system controller 110. Other elements and/or couplings among the elements may be apparent to skilled practitioners in the relevant art(s).

The volatile memory in this embodiment is an SDRAM 102 (Synchronous Dynamic Random Access Memory). Other types of volatile random access memory may also be used. The nonvolatile memory in this embodiment is a NAND FLASH 104, and again, other types of nonvolatile memory may be used.

The analog power control circuitry 106 interfaces the memory subsystem to an external power source, typically the power source of a larger system that incorporates and uses the hybrid memory subsystem. For example, the external power source may be the power of personal or business computer system that incorporates the memory subsystem.

The analog power control circuitry 106 also interfaces the memory subsystem to a backup power source that is local to the memory subsystem. The backup power source may be, for example, a capacitor 108 or small battery (or a combination of the two). In the embodiment of FIG. 1, a capacitor 108 provides power to the memory subsystem for a temporary time when external power fails. The capacitor 108 may provide power for long enough to copy data blocks from volatile memory 102 to nonvolatile memory 104.

In the event of an external power failure, the hybrid memory subsystem may operate as an isolated subsystem of the larger, external system. The analog power circuitry 106 may recognize that external system power has failed. The system controller 110 may then initiate backup of data currently stored in the volatile memory 102 into the non-volatile memory 104. Herein, the term "backup" means that data of the volatile memory 102 is stored into the nonvolatile memory 104. Upon restoration of external system power, the system controller 110 may initiate restoration of backed-up data from non-volatile memory 104 to volatile memory 102. Herein, the term "restore" and "restoration" means that data of the nonvolatile memory 104 is stored into the volatile memory 102.

The system controller 110 may thus include logic to backup data from volatile memory 102 to nonvolatile memory 104 when the external power source fails, and to restore data from nonvolatile memory 104 to volatile memory 102 when the external power source becomes available.

Those skilled in the art will appreciate that various functional components, such as the power controller logic 106 and the system controller logic 110, and even the volatile memory 102 and nonvolatile memory 104, may in fact be implemented together as one or more integrated circuit devices, and packaged as one or more discrete physical components.

Data stored within the hybrid memory subsystem persists even when the power of the external system fails. The external system may interact with the hybrid memory subsystem as though interacting with volatile memory 102 (of the same or another type), even though, transparently, the data is stored internally by the memory subsystem in nonvolatile memory 104 persistently in the absence of external system power.

The hybrid memory system may write data to non-volatile memory 104 only in the event that external system power fails. Thus, the non-volatile memory 104 undergoes many fewer write cycles than would occur if it were being written every time data were written to the hybrid memory subsystem. When the non-volatile memory 104 is a low-cost, limited duty cycle NAND FLASH, the result in an extension of the useful lifetime of the non-volatile memory 104.

The system controller 110 provides a memory interface to the external system. The memory interface may comprise a standard data and control interface for some particular kind of volatile memory. For example, the system controller may provide an SDRAM data, address, and control interface to the external system. The interface provided to the external system may or may not be the interface for the type of volatile memory 102 actually used by the memory subsystem.

The system controller 110 may additionally provide an interface whereby the external system may send commands to the hybrid memory subsystem or obtain status. For example, in some embodiments the external system may command the hybrid memory subsystem to initiate a backup of data from volatile memory 102 to non-volatile memory 104, even though the system power is still available. Additionally or alternatively, the hybrid memory subsystem or external system may provide a direct user interface, such as a switch or control on a graphic user interface, whereby a user of the external system may directly initiate a copy of data from volatile 102 to non-volatile memory 104. Another action which may in some embodiments be initiated either through the system interface of the system controller 110, or directly by a user, is restoring data from non-volatile memory 104 to volatile memory 102. In some embodiments the external system may use its system interface to the hybrid memory controller 110 to initiate a self test of the hybrid memory subsystem.

Other examples and/or embodiments of the various system components may now be apparent to skilled practitioners in the relevant art(s).

Hybrid Memory Subsystem Operation

As previously described, the system controller 110 may comprise logic to interface the volatile memory 102 to an external system, such as a personal computer system or a business computer system. Other examples of applications of the hybrid memory subsystem are embedded control applications, communications, and consumer products.

The system controller 110 may present an interface to the external system, so that the volatile memory 102 is addressable for reading and writing of data by the external system.

Logic of the power controller 106 may detect when power from the external system to at least one of the volatile and nonvolatile memories and to the controller fails. For example, the external system may suffer a power source outage or battery failure. When external system power fails, the power controller 106 may provide backup power to the volatile memory 102, nonvolatile memory 104, and to the controller 110 for long enough to enable the backup of data from the volatile memory 102 to the nonvolatile memory 104. The capacitor or battery power source 108 may act as the source of this backup power.

In some embodiments, the controller 110 may include logic to enable the external system to initiate a backup of data from the volatile memory 102 to the nonvolatile memory 104, instead of waiting for a power failure to initiate the backup. The controller 110 may also comprise logic to emulate to the external system a type of volatile memory other than a type of the volatile memory. For example, internally the memory subsystem may employ SDRAM for the volatile memory 102. However, the controller may include logic to emulate single data rate RAM (SDRAM), double data rate RAM (DDRAM), DDR2, asynchronous SRAM, C-F card, or PCI-Express (among other examples) to the external system.

The volatile memory 102, nonvolatile memory 104, controller 110, and power controller 106 may implemented in various ways. For example, these components may be implemented as one of a multi-chip set, a board subsystem, or even a single chip.

The embodiment shown in FIG. 1 shows that backups and restores of data are implemented as data moves from the volatile memory 102 to the nonvolatile memory 104, and vice versa, via the controller 110. In other embodiments, backups and restores may be implemented via data moves from the volatile memory 102 to the nonvolatile memory 104 directly, without passing through the controller 110.

Figure 2:
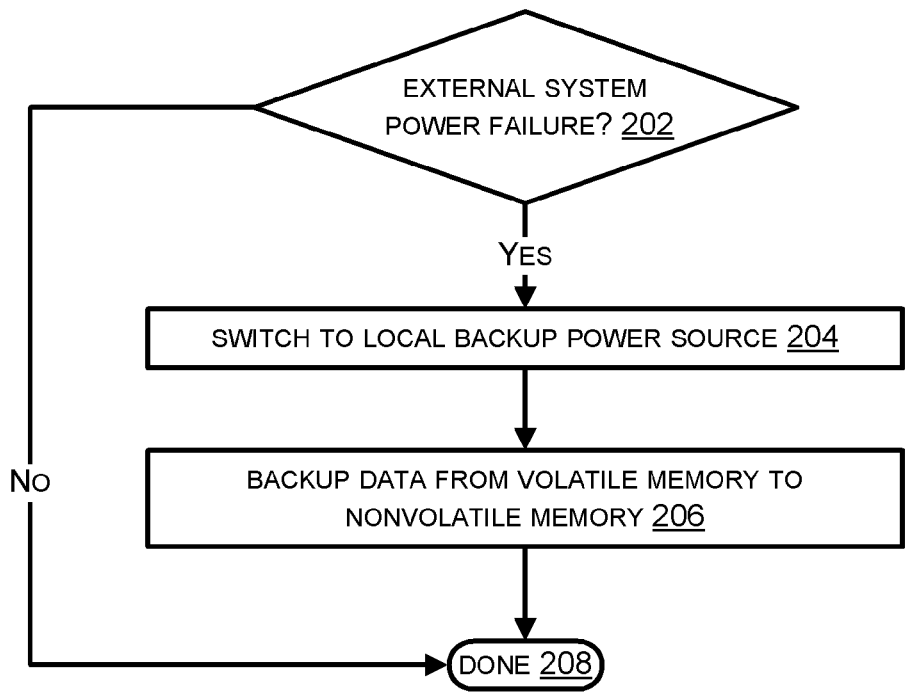
FIG. 2 is a flow chart of an embodiment of a data backup process.

FIG. 2 is a flow chart of an embodiment of a data backup process. If external system power fails (see 202), backup power from a local source, such as a capacitor, is applied to operate the memory subsystem (see 204). Data is backed up from volatile memory to nonvolatile memory, see 206. At 208 the process concludes.

The backup power source has been discussed in terms of one or more capacitors local to the hybrid memory subsystem. However, the backup power source, such as one or more capacitors, may also be provided by the external system.

The backup power source may be applied upon failure of external system power (i.e. the primary power source), which may involve some form of switching function from primary to backup power. Power switching functions inherently involve some latency (switching time), which may provide a vulnerability to losing all power to the memory subsystem if the switching function fails, or becomes too slow. Thus, in some embodiments power is always supplied to the hybrid memory subsystem via the backup power source. The hybrid memory subsystem may for example always draw power from one or more backup power capacitors, which in turn are continually recharged from external system power when such power is available. Upon external system power failure, the memory subsystem continues to draw power from the backup power capacitors, drawing down their voltage, while for example performing a power-down save of data in volatile memory 102 to nonvolatile memory 104.

Thus, the term "external system power" may refer to power from the external system as applied to the memory subsystem via one or more backup power sources, such as power capacitors. The term "backup power" may refer to power applied to the memory subsystem via the backup power sources once power from the external system fails.

The memory subsystem is thus isolated from the external system that uses it in at least two ways. First, memory access isolation is provided by interposing the controller interface 110 (which may or may not be the same as the volatile memory 102 interface) between the memory subsystem and the external system. Second, power isolation from the main system may be provided by "gating" external system power through the backup power source.

Upon restoration of external system power, logic of the controller 110 may operate to restore data from the nonvolatile memory 104 to the volatile memory 102.

Figure 3:
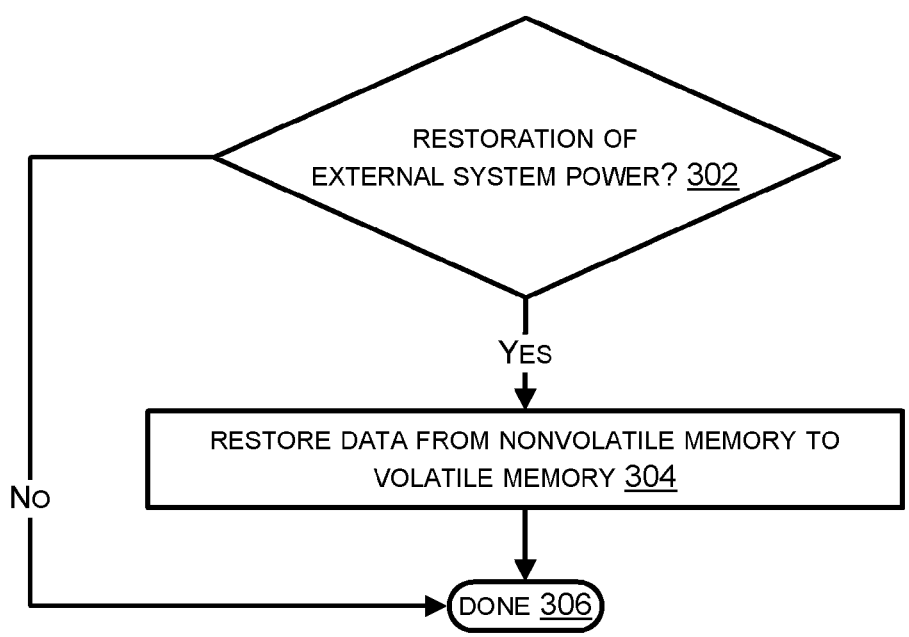
FIG. 3 is a flow chart of an embodiment of a data restoration process.

FIG. 3 is a flow chart of an embodiment of a data restoration process. At 302, if there is restoration of external system power, the analog control circuitry recognizes the power restoration. At 304, data is restored from nonvolatile memory to volatile memory. At 306 the process concludes.

Figure 4:
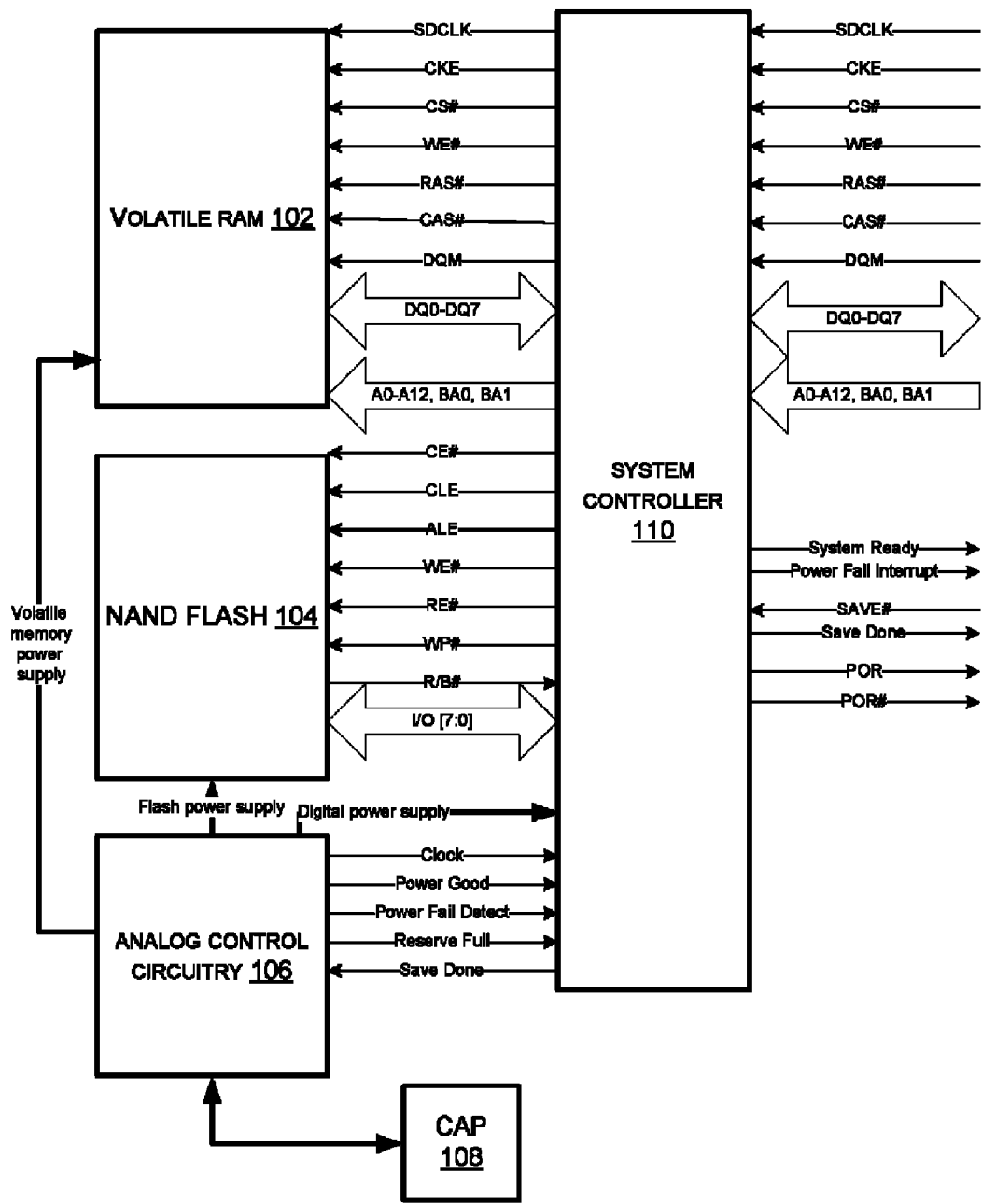
FIG. 4 is a block diagram of an embodiment of a hybrid memory subsystem that provides an external system with an SDRAM interface.

FIG. 4 is a block diagram of an embodiment of a hybrid memory subsystem that provides an external system with an SDRAM interface. The system is architecturally similar to the embodiment of FIG. 1. The hybrid memory subsystem provides SDRAM-compatible data, address, and control/status signaling to the external system. Thus, the external system may interact with the hybrid memory subsystem in the same manner as it would interact with a typical SDRAM. The external system need not have a modified interaction with the hybrid memory subsystem that accounts for the presence of the non-volatile memory 104. Interaction between the volatile memory 102 and the non-volatile memory 104 in the event of a power failure are handled internally by the hybrid memory subsystem. Details of this interaction need not be exposed to the external system.

The controller 110 implements the interface to the non-volatile memory 104 internally, so that this interface is not exposed to the external system. The controller 110 comprises logic to drive the interactions between the volatile memory 102 and the non-volatile memory 104 in the event of failure or shutdown of external system power, and restoration of external system power.

In the embodiment of FIG. 4, the hybrid memory subsystem controller 110 provides a 'pass through' of data, address, and control signals from the external system to the volatile memory 102. This is possible when the controller 110 provides the external system with a volatile memory interface that is consistent with the type of volatile memory actually used internally by the hybrid memory subsystem. For example, if the interface to the external system is an SDRAM interface, and the hybrid memory subsystem uses SDRAM for volatile memory internally, the controller 110 may 'pass through' signals from the external system to the internal SDRAM. Performance benefits may be obtained from such 'pass through' signaling.

In the embodiment of FIG. 4, the hybrid memory subsystem controller 110 may alternately provide a 're-clocking' of data, address, and control signals from the external system to the volatile memory 102. This is possible when the controller 110 provides the external system with a volatile memory interface that is consistent with the type of volatile memory actually used internally by the hybrid memory subsystem but retiming the signals by one or more clock delays. For example, if the interface to the external system is an SDRAM interface, and the hybrid memory subsystem uses SDRAM for volatile memory internally, the controller 110 may 're-clock" or re-register" signals from the external system to the internal SDRAM. Alternate performance behavior may be obtained from the approach of 're-clocking' signals.

In other situations, the internal volatile memory 102 may be of a different type than the interface provided by the controller 110 to the external system. In this case, the controller 110 may translate signals from the external system to be compatible with the type of the internal volatile memory 102. There may be some performance cost associated with such signal translation.

The controller 110 may expose additional control/status signaling to the external system. This additional signaling may enhance and/or modify the typical volatile memory interface exposed to the external system by the controller 110. The external system may or may not comprise logic to take advantage of this additional signaling.

Capacitor Power Delivery Verification

The capacitor 108 or other backup power source is a crucial component for enabling reliable operation of the memory subsystem in the event of a discontinuation of external system power. Thus, it is important that the capacitor 108 or other backup power source always be operationally ready.

Figure 5:
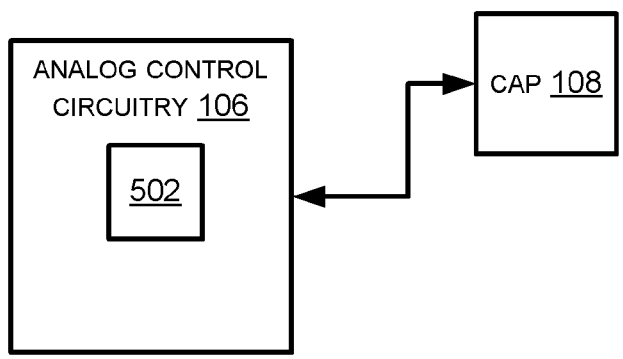
FIG. 5 illustrates an embodiment comprising more than one backup power capacitors.

FIG. 5 is a block diagram of an embodiment of capacitor verification logic 502. The capacitor verification logic 502 may be comprised by the power controller 106, although this need not always be the case. The verification logic 502 may operate to verify proper function and rating of one or more backup power capacitors.

Some embodiments may use multiple power capacitors. Using multiple power capacitors may have several benefits, including delivery of additional backup power, and redundancy for more reliable operation. For example, if one power capacitor fails, the system may still operate reliably using backup power from the other capacitors. Capacitors are typically inexpensive relative to other system components, so that these benefits may be obtained at relatively low incremental cost over using a single power capacitor.

The logic 502 may verify that the at least one power capacitors, e.g. capacitor 108, has sufficient power to enable a data backup from volatile memory 102 of the memory subsystem to nonvolatile memory 104 of the memory subsystem in the event that external system power is discontinued.

Figure 7:
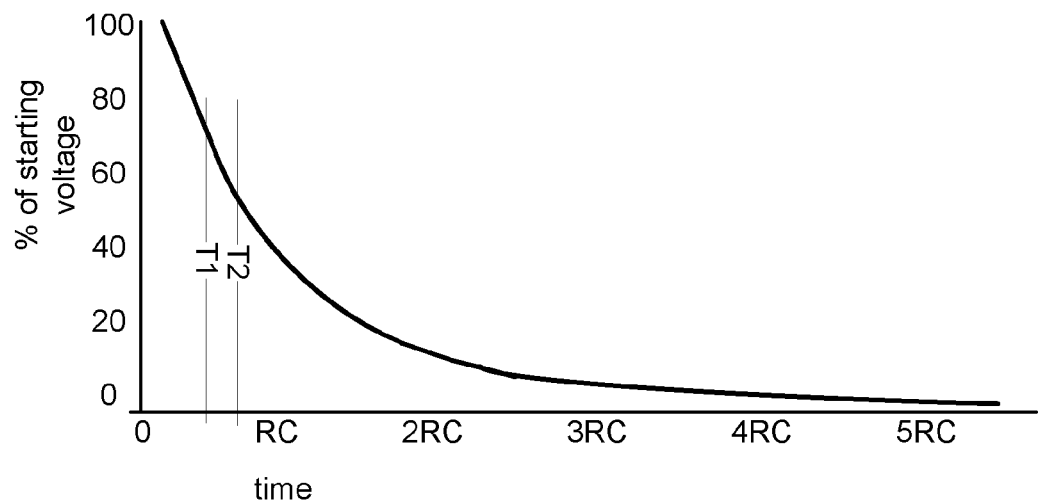
FIG. 7 is an illustration of an embodiment of a capacitor discharge curve under a predetermined load (R) and voltage.

Verification of the power capability of a capacitor may be accomplished in a number of ways. One way is to time at least one of a charge and discharge rate of the capacitor using a predetermined load and voltage. FIG. 7 is an illustration of an embodiment of a capacitor discharge curve under a predetermined load (R) and voltage. Time T1 represents a point on the discharge curve at which a first voltage measurement is made, and T2 the point at which a second voltage measurement is made. Both measurements may be made within the capacitor's operational zone during a data backup. If the rate of discharge becomes too great, it may indicate that the capacitor is of an improper value, miss-installed or has degraded and is nearing the end of its reliable life.

Another way to verify capacitor power delivery capability is to measure an ending voltage of the capacitor at an end of a data backup operation from the volatile to the nonvolatile memories, and to determine if there is a sufficient voltage margin to provide reliable data backup. Referring again to FIG. 7, the capacitor's voltage may be measured at T1, at the end of a complete data backup from volatile memory 102 to nonvolatile memory 104. The voltage at T2 may represent a reference point for determining the capacitor's margin of operation. If the voltage difference between T1 and T2 provides an insufficient margin of operation, the capacitor may be ending its useful reliable life or the power load represented by the elements 102, 104, 106 and 110 or harsh environmental conditions exceed that for which the subsystem was designed.

Figure 8:
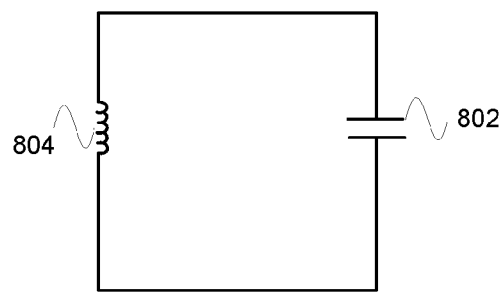
FIG. 8 is a diagram of an embodiment of an LC (inductive-capacitive) loop circuit.

Yet another way to verify capacitor power delivery capability is to measure a natural oscillation frequency of the capacitor when the capacitor is re coupled to a predetermined impedance (one that includes an inductive component). FIG. 8 is a diagram of an embodiment of an LC (inductive-capacitive) loop circuit, i.e. an inductive RC oscillator. The inductance 804 may be coupled into a loop with the capacitor 802 for purposes of power verification. The capacitor 802 may discharge into the inductance 804, and vice-versa, creating a natural resonance frequency in the loop. This frequency may characterize the capacitance of the capacitor 802, which provides an indication of the capacitor's 802 power delivery capability.

More advanced embodiments may go further, and may include logic to measure and apply one or more of an operating temperature, operating voltage, and component age of the capacitor when performing power verification. Some embodiments may even apply prior operational behavior of the system and/or capacitor when performing power verification.

Capacitor power verification may be performed under different circumstances. For example, verification may occur upon restoration of external system power, after such power has been discontinued or when such power is applied for the first time. This situation is illustrated in FIG. 6, which is a flow chart of an embodiment of capacitor power verification at system power-up.

Figure 6:
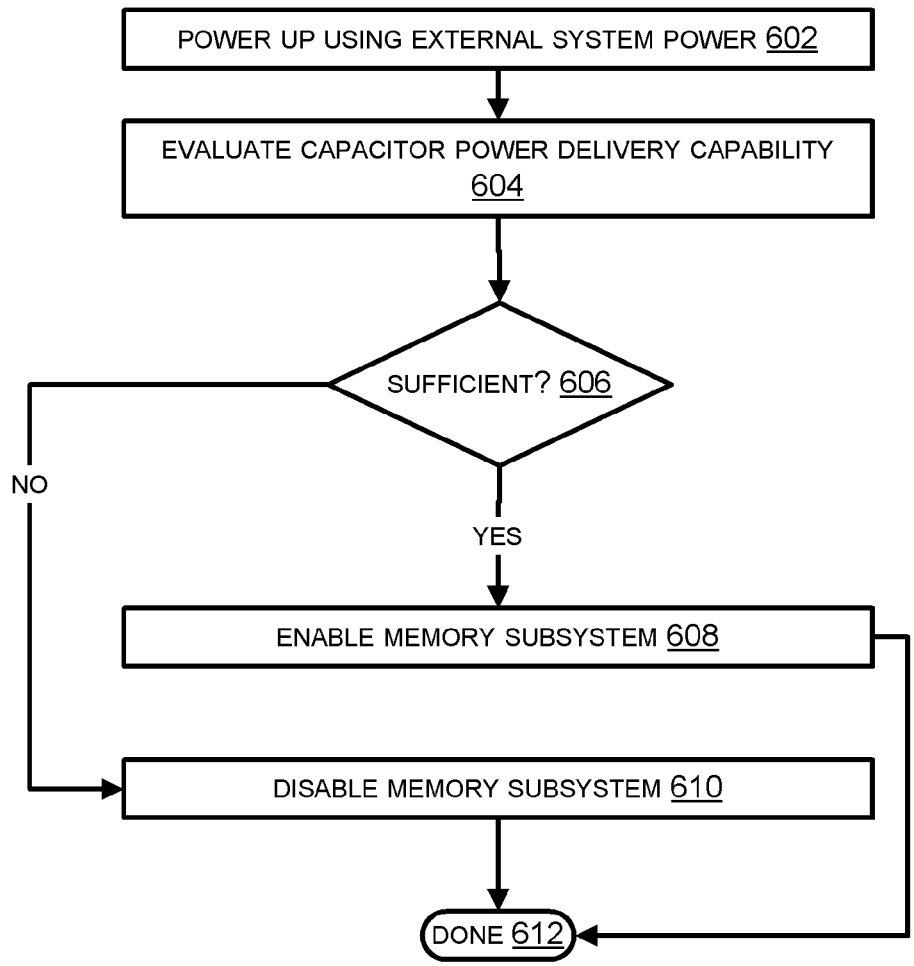
FIG. 6 is a flow chart of an embodiment of capacitor power verification at system power-up.

In FIG. 6, external system power is applied (602) and capacitor power delivery capability is determined at that time (604). If the capacitor has sufficient power capability (606), the memory subsystem is enabled (608). Otherwise, the memory subsystem is disabled (610). At 612 the process concludes.

In other embodiments, verification may occur periodically, after a certain time interval has passed, or at certain times of the day or on certain dates. Verification may occur in response to a signal from the external system, such as a signal produced as a result of executing a diagnostic routine.

The verification logic 502 may signal the external system with an indication of the result of capacitor power verification. For example, the logic 502 may signal the external system with an indication that the memory system is fully functional, non-functional, or functional in a degraded mode of operation, according to a result of power verification of the capacitor(s). The memory subsystem may, in some cases, be placed into a degraded mode of operation if the power verification indicates that the capacitor(s) do not comprise enough power for a full data backup from volatile memory 102 to nonvolatile memory 104 in the event of a discontinuation of external system power. One example of a degraded mode of operation is a reduction in the 'advertised' memory capacity of the memory subsystem. For example, if the verification logic 502 determines that the power capacitor comprises only enough power to backup 50% of the data in volatile memory 102 to nonvolatile memory 104, the memory subsystem may indicate to the external system that it only has 50% of its fully-functional memory capacity.

In some embodiments, the verification logic 502 may prioritize the use of multiple capacitors for backup power according to results of power verification. For example, all else being equal capacitor 108 may be the primary backup power source, with other capacitors being second and tertiary sources. However, if verification indicates that capacitor 108 is only operational at 60% of its full power rating, the verification logic may cause one of the backup capacitors to become the primary backup power source instead, with a third capacitor being a secondary source and the capacitor 108 the tertiary source.

Memory Subsystem Initialization

Figure 9:
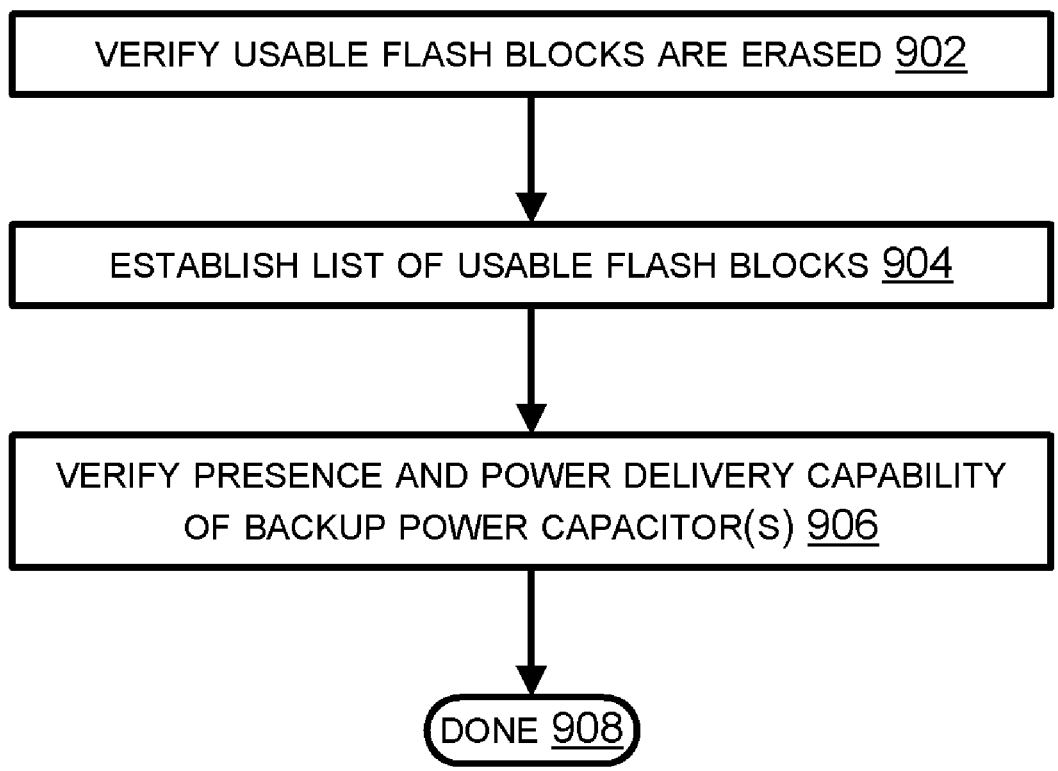
FIG. 9 is a flow chart of an embodiment of a process to initialize a hybrid memory subsystem.

FIG. 9 is a flow chart of an embodiment of a process to initialize a hybrid memory subsystem. The memory subsystem may be initialized on first use, and/or at other times. The memory subsystem may be initialized to place it into an operational power-up state without populating its volatile memory 102 with data stored in its non-volatile memory 104. In some embodiments, the controller 110 may initiate, direct, and/or perform the initialization.

Initialization may involve capacitor verification, described above, as well as verification of the nonvolatile memory capability.

The nonvolatile memory capability may be verified (902), for example by checking that the minimum amount of usable flash blocks are in an erased state to support a power loss save operation. This may take place in embodiments where flash memory is used for the nonvolatile memory 104. Verification that a usable flash block is in an erased state may involve examining each erasable flash block to determine if it is "dirty", i.e. has been programmed, and, if so, erasing it. A list of usable, erased flash blocks may be established (904).

The presence and power delivery capability of the backup power source for the hybrid memory subsystem may also be verified (906). The backup power source may be a capacitor or capacitors. Verification of the presence and power delivery capability of the backup power source helps ensure that in the event of power failure, sufficient backup power will be available to backup the data content of the volatile memory 102 to the nonvolatile memory 104. At 908, the initialization is complete.

Power Down Interrupt Recovery

Figure 10:
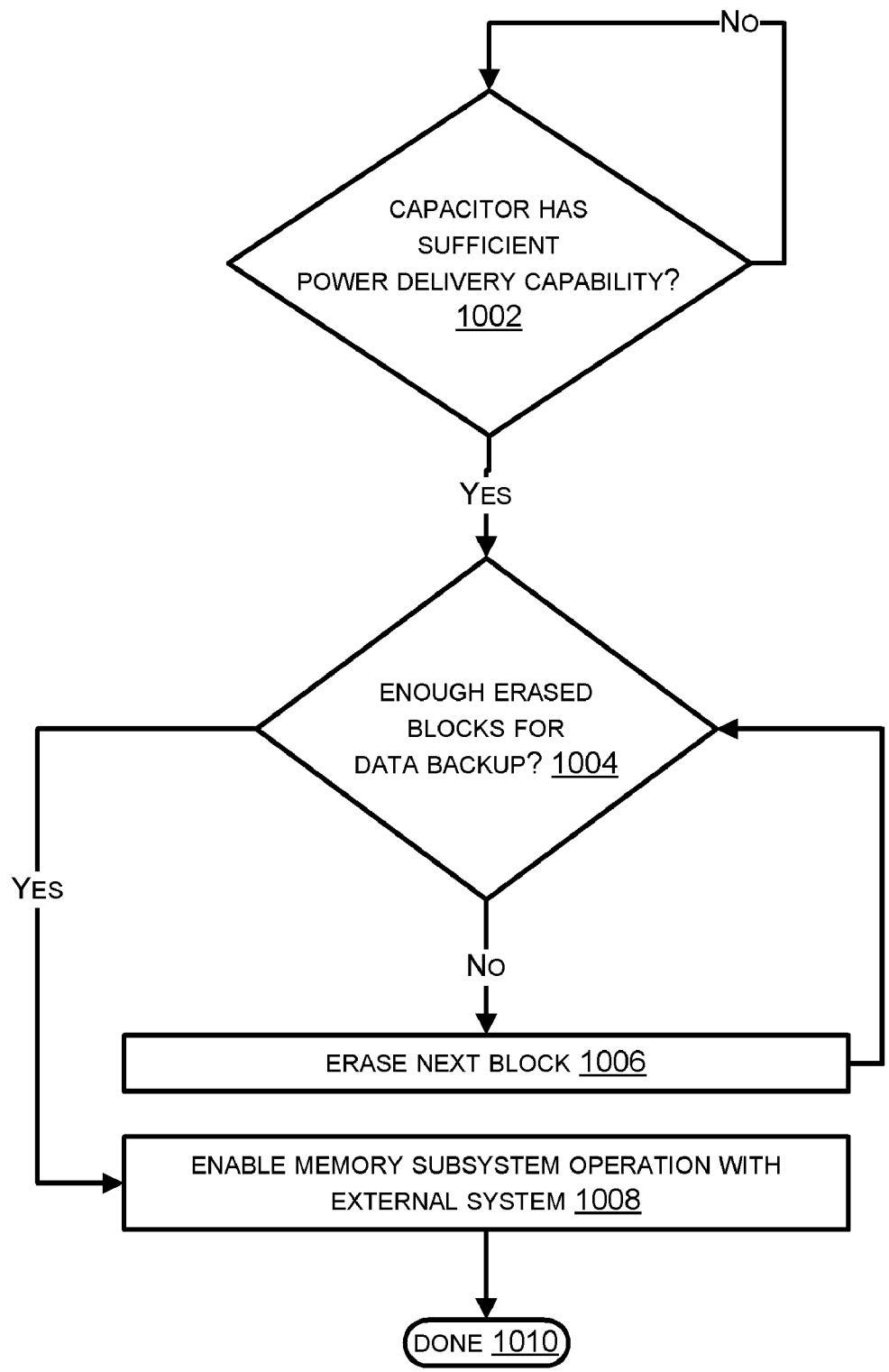
FIG. 10 is flow chart of an embodiment of a process whereby the hybrid memory subsystem responds to a resumption of external system power during a power-down save operation initiated as a result of external system power failure.

FIG. 10 is flow chart of an embodiment of a process whereby the hybrid memory subsystem responds to a resumption of external system power during a power-down save operation initiated as a result of external system power failure. In other words, the situation is one is which external system power fails, and then is restored before the memory subsystem can complete a backup of data from volatile memory 102 to nonvolatile memory 104. The controller 110 may initiate, direct, and/or perform the power down interrupt recovery process.

"Interrupt Recovery Time" is the time between when external system power is restored after failing, and when the memory subsystem is again available for use by the external system. To reduce the interrupt recovery time, the memory subsystem may signal the external system that it is ready for use as soon as enough nonvolatile memory 104 space is available to completely backup the contents of volatile memory 102.

If another failure of external system power occurs while the system is processing a resumption of power, the power-down save operation that was previously interrupted by the resumption of external system power may be resume where it left off.

The memory subsystem may comprise logic to delay enabling use of the memory subsystem by the external system after a power down save operation of the memory subsystem is interrupted by restoration of external system power. The delay will typically be at least long enough to allow the memory subsystem to ensure that sufficient nonvolatile memory capacity of the memory subsystem is available to backup an amount of volatile memory capacity that the memory subsystem makes available (i.e. provides) to the external system.

In one embodiment, the delay is incurred while the memory subsystem erases sufficient dirty blocks of nonvolatile memory to backup the amount of volatile memory capacity that the memory subsystem provides to the external system. However, if sufficient nonvolatile memory capacity is already available to backup the amount of volatile memory capacity that the memory subsystem provides to the external system, no delay may be incurred, and the memory subsystem may indicate its substantially immediate availability to the external system.

In some embodiments, the memory subsystem may indicate to the external system that it is available for use, but may update the amount of volatile memory capacity that it makes available to the external system as more and more nonvolatile memory capacity is made available, for example by erasing nonvolatile memory blocks.

At 1002, the memory subsystem examines whether the backup power source, in this embodiment a capacitor, has enough power to handle a complete power down operation, including backup of data from volatile memory 102 to nonvolatile memory 104. In some embodiments, 1002 may not take place every time during power down interrupt recovery. The return of external power during a power down backup operation may result in the suspension of the backup process from volatile memory 102 to nonvolatile memory 104. In this situation, the volatile memory 102 continues to have power and retain its data content. It may therefore be unnecessary to continue the backup of data of the volatile memory 102 to nonvolatile memory 104 if external system power is restored before completing the backup or running out of backup power. Nonetheless, the memory subsystem may not signal the external system that it is ready for use until there is sufficient usable and erased memory capacity in the nonvolatile memory 104 for a complete backup of the contents of the volatile memory 102. Otherwise, if external system power failed again very soon after it was restored, it might create a situation in which there was not enough capacity in the nonvolatile memory 104 to completely backup the contents of the volatile memory 102, and valuable data could be lost.

An evaluation (1004) is made of whether there is enough usable erased flash memory blocks to perform a backup of the contents of volatile memory 102 to non-volatile memory 104 in the event of a subsequent failure of external system power. The next data block is erased (1006) until there are a sufficient number of erased and available nonvolatile memory blocks. When there are enough usable erased flash memory blocks to perform a data backup of volatile memory 102 to nonvolatile memory 104, the memory subsystem indicates that it is available for use by the external system (1008). This indication may take the form of a signal to the external system, or a status indication available for reading by the external system. At 1010, the process is complete.

If the power fails at any time after one or more flash memory blocks are erased at 1006, the interrupt recovery process is terminated and data backup resumes from volatile memory 102 to nonvolatile memory 104 for the blocks that were erased, but not necessarily for blocks that were not erased (unerased blocks remain backed up in the nonvolatile memory). Thus, the memory subsystem may include logic to erase sufficient dirty nonvolatile memory to backup the amount of volatile memory capacity that the memory subsystem provides to the external system before enabling use of the memory subsystem by the external system. In the event that external system power fails before enabling use of the memory subsystem, the memory subsystem may backup at least portions of the volatile memory having data corresponding to data erased from the nonvolatile memory.

Figure 11:
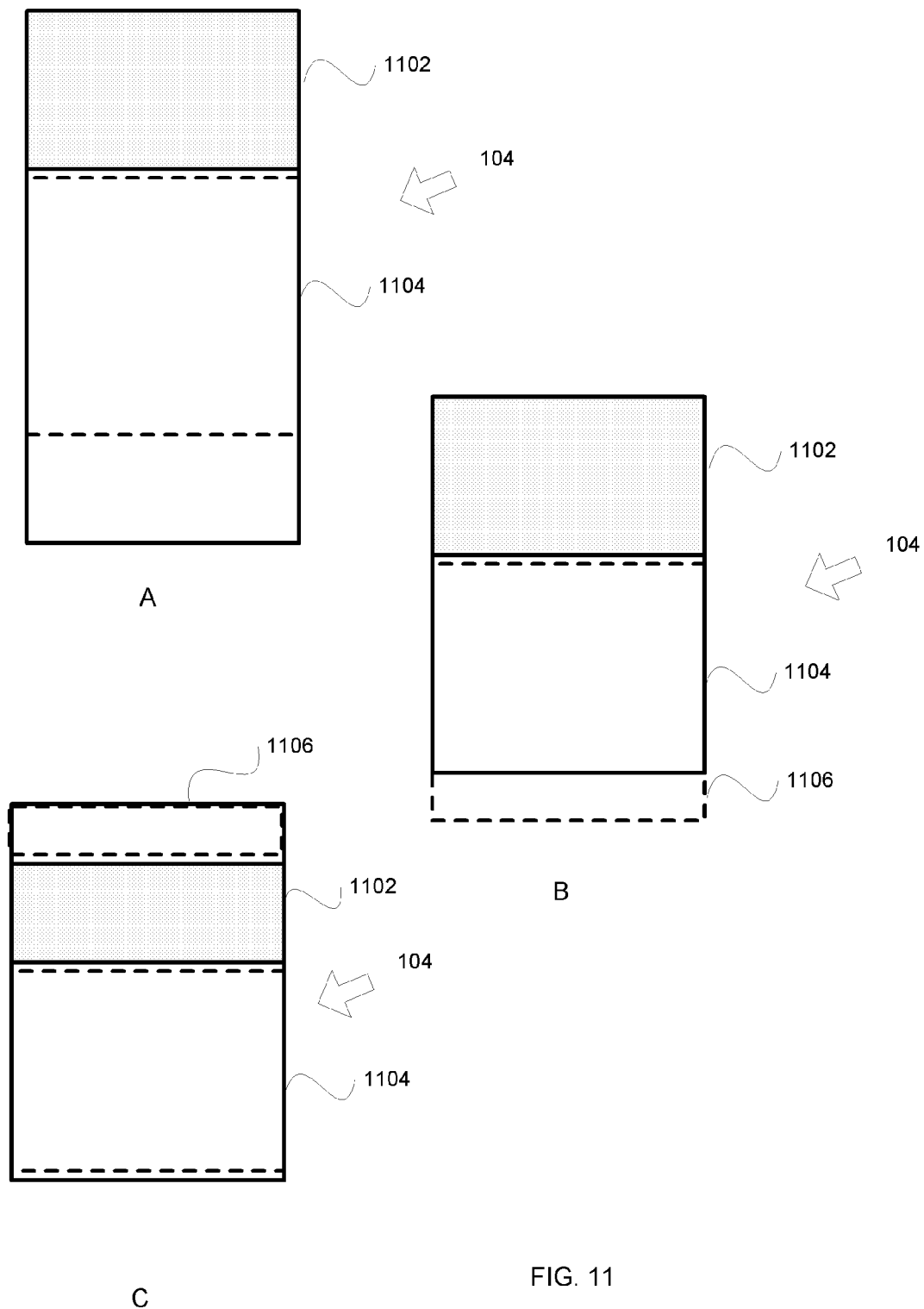
FIG. 11 is a memory allotment map for several power down nonvolatile memory capacity situations.

FIG. 11 is a memory allotment map for several power down nonvolatile memory capacity situations. Again, the controller 110 may initiate, direct, and/or perform this process.

A flash memory 104 comprises "dirty" blocks 1102, which have been programmed, and "usable" blocks 1104 which are in an erased state and not otherwise impaired. In FIG. 11 the area between the dotted lines indicates a quantity of nonvolatile memory 104 needed to perform a data backup of the entire contents of the volatile memory 102, in the event of external system power failure. In condition A, although the nonvolatile memory 104 has some dirty blocks 1102, there are more than enough usable erased blocks 1104 to perform a data backup operation. In fact, the total flash memory capacity may often be over two times the size of the volatile memory 102, so in that case there will typically be enough erased blocks available to backup the volatile memory 102 contents in the event of external system power failure. The memory subsystem should thus be available soon after external system power up for use by the external system.

The dirty blocks and erased usable blocks are illustrated as contiguous ranges. However, such contiguous placement may not always be the case, and the process is generally the same regardless of the contiguous or noncontiguous nature of the nonvolatile memory blocks.

The nonvolatile memory 104 as illustrated in state B also has dirty blocks 1102 and erased usable blocks 1104. In this case, however, there are not enough erased and useable blocks in the nonvolatile memory 104 to fully backup the contents of the volatile memory 102. A portion 1106 of the space needed to backup the volatile memory 102 is not yet available as erased blocks.

The nonvolatile memory 104 as illustrated in state C may have originally had the same quantity of dirty and erased flash blocks as in state B. However, the quantity 1106 of erased blocks which were needed but unavailable in state B have now been obtained through erasure of dirty blocks in the memory 104. Therefore, the memory 104 in state C now has fewer dirty blocks and more erased blocks than it did in state B, with the result that it has enough erased usable blocks to perform a backup of the entire contents of the volatile memory 102. When performing an erasure of dirty blocks, it is not necessary that the blocks that are erased are done so in any particular location or order. The memory subsystem may indicate to the external system that it is ready for use once the number of useable and erased blocks is equal or greater than the amount of the volatile memory 102 that will be used by the external system.

Power Up Restore

Figure 12:
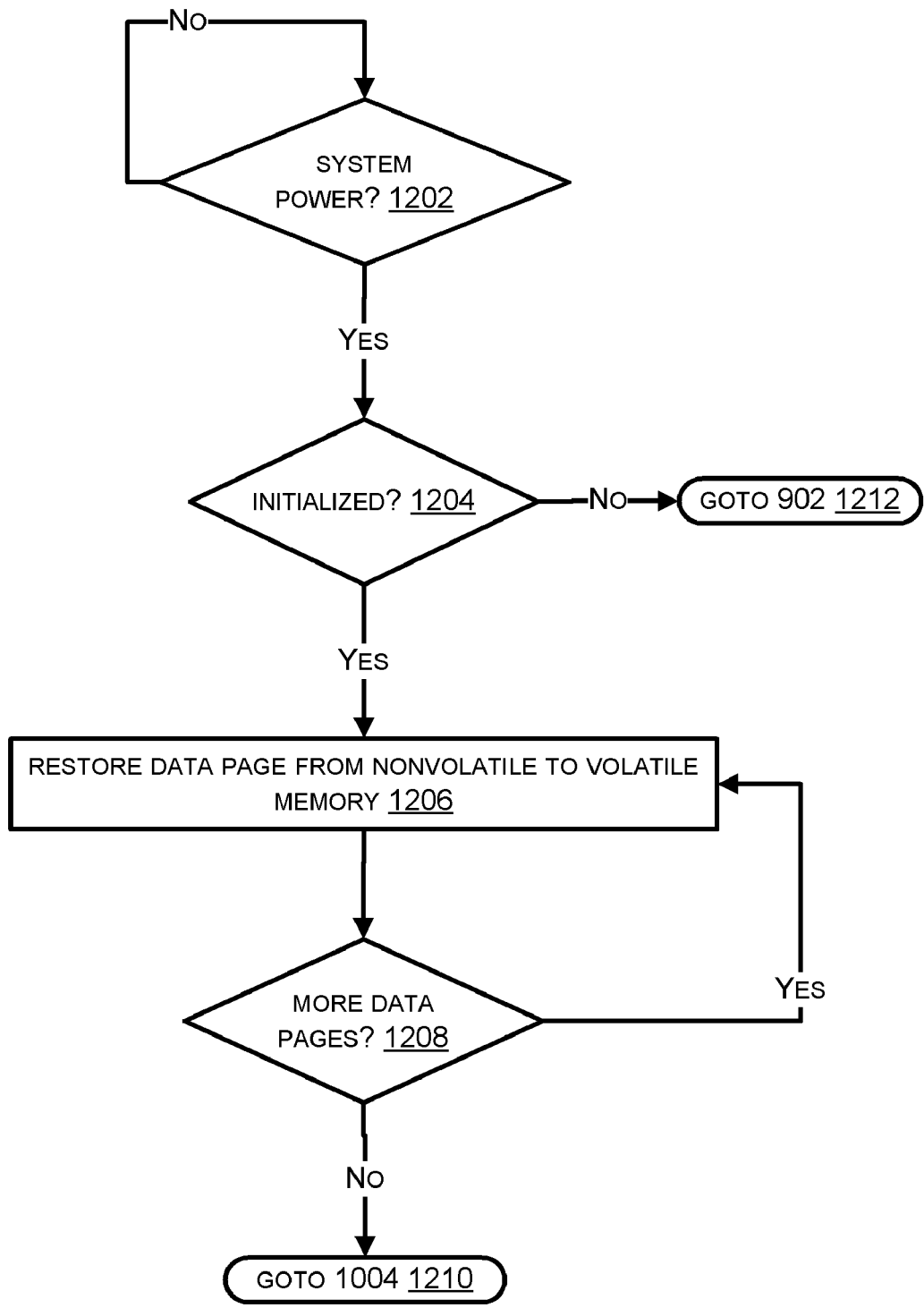
FIG. 12 is a flow chart of an embodiment of the power up restore process for a hybrid memory subsystem.

FIG. 12 is a flow chart of an embodiment of the power up restore process for a hybrid memory subsystem. The power up process may include a data restore from nonvolatile (e.g. flash) memory 104 to volatile memory 102. As with other procedures described herein, the controller 110 may initiate, direct, and/or perform the power up process.

Once the external system power is available (1202), if initialization process has not been performed (1204), initialization is commenced at FIG. 9, 902.

If the subsystem is in a properly initialized state, one flash memory page of data is restored to volatile memory (1206). This continues so long as more flash memory pages are available to be restored (1208).

When all flash memory pages containing data to be restored to volatile memory have been processed, the action continues at 1004 of FIG. 10.

If the external power fails anytime during 1204, 1206, or 1208, the process may be terminated. The memory subsystem may thus include logic to eliminate a data backup from volatile memory 102 of the memory subsystem to nonvolatile memory 104 of the memory subsystem if external system power is restored before the data backup is completed.

Data from volatile memory 102 remains fully backed up in nonvolatile memory 104, and nothing more need be done in terms of backup and restore before shutting down the memory subsystem. Typically, the memory subsystem may not begin erasing blocks in nonvolatile memory 104 until the restore is fully performed.

Thus, the memory subsystem may include logic to restore data from the nonvolatile memory 104 to the volatile memory 102 after restoration of external system power, but before ensuring that sufficient nonvolatile memory capacity of the memory subsystem is available to backup an amount of volatile memory capacity that the memory subsystem provides to the external system. The memory subsystem may restore the data from the nonvolatile memory 104 to the volatile memory 102 after restoration of system power only if the restoration of system power did not interrupt a power down save operation.

Power Down Save

Figure 13:
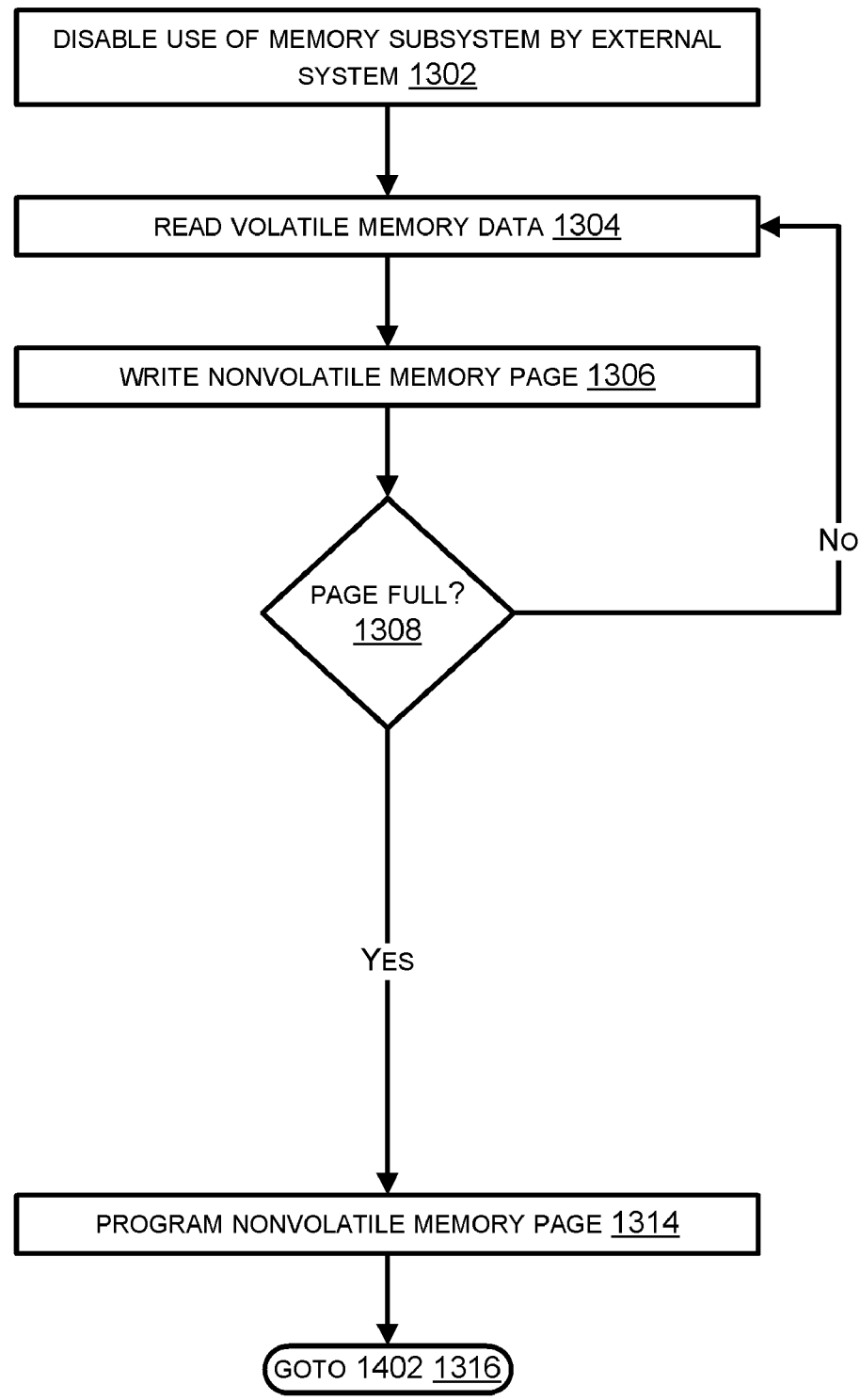
FIGS. 13 and 14 are flow charts of an embodiment of a hybrid memory subsystem power down process, invoked after external system power fails.
Figure 14:
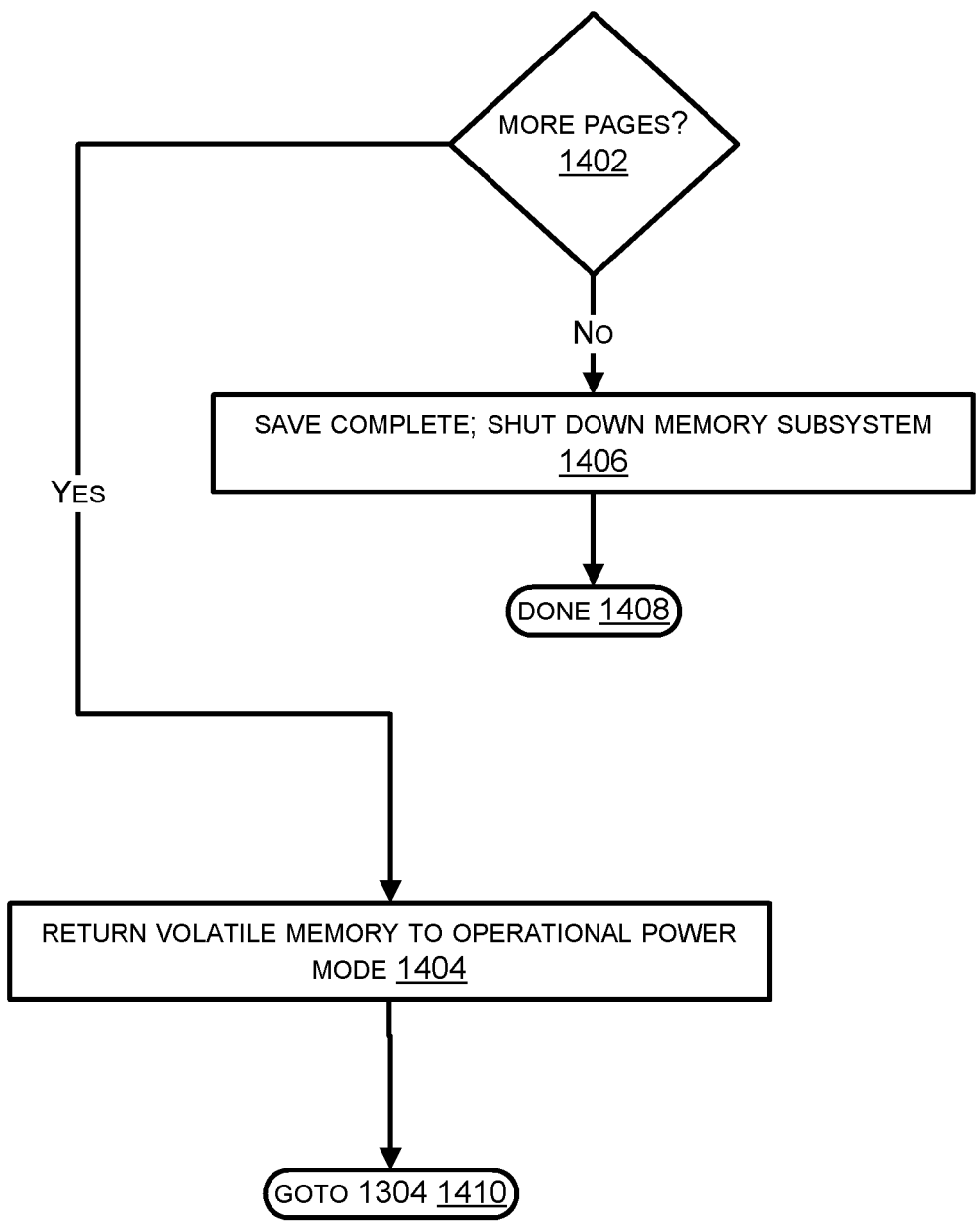

FIGS. 13 and 14 are flow charts of an embodiment of a hybrid memory subsystem power down process, invoked after external system power fails. The power control logic 106 may detect external system power failure and signal the controller 110. The controller 110 may initiate, direct, and/or perform the power down process.

The memory subsystem may first disable the external system's use of the memory subsystem (1302). This disabling of the external system is usually done with the awareness and participation of the external system such that the external system may complete any atomic data operations. Once disabled, data may then be read from the volatile memory (1304). This data may be written to a non-volatile memory page (1306). The non-volatile memory page just written may now be written with data (1308). Non-volatile memory pages may be written in small data increments (whereas they are typically read or erased in increments of one block at a time). The amount of data read from volatile memory may not fill the non-volatile memory page, in which case more data for writing is read from volatile memory (1304). The non-volatile memory page is full at 1314.

A new nonvolatile memory page programming operation may now be performed. The integrity of data not yet read from the volatile memory should be preserved for the duration of this page programming operation. For DRAM memories requiring refresh this may be accomplished by performing a burst refresh of the volatile memory based on the worst case duration of the page program time. A new non-volatile memory page is programmed at 1314. Processing continues at FIG. 14, 1402.

If there is more data to save to nonvolatile memory and more pages of non-volatile memory to program (1402), volatile memory is returned from the low power mode to a fully operational state so that it may be read to obtain the unsaved data (1404). Processing continues at FIG. 13, 1304.

If there is not more data to save from volatile to nonvolatile memory, the memory subsystem is shut down (1406), and the process is complete (1408).

Thus, the memory subsystem may include logic to burst refresh the volatile memory 102 for a time at least equal to a worst-case nonvolatile page preparation time, to place the volatile memory 102 into a lower than fully operational power state while a new nonvolatile memory page is prepared and written, and to restore the volatile memory 102 to a fully operational power state after the new nonvolatile memory page is prepared and written.

Figure 15:
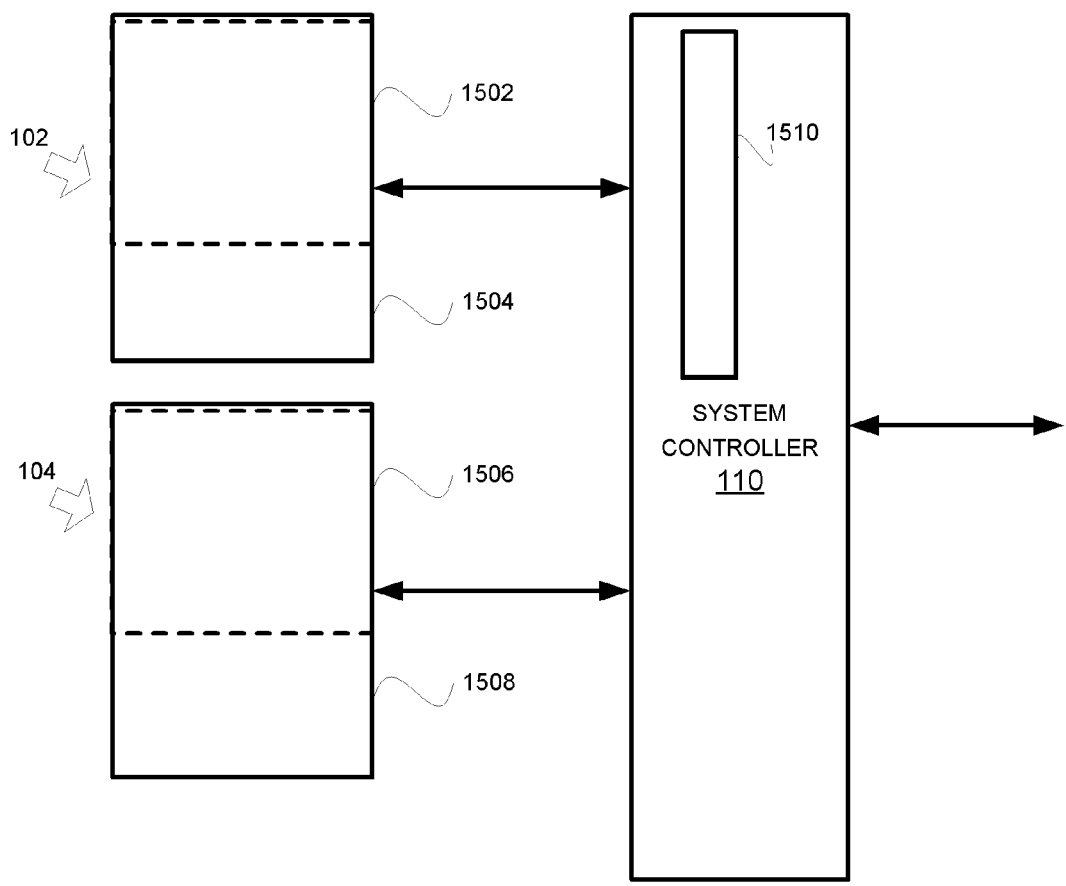
FIG. 15 is a block diagram of an embodiment of variable partitioning in a hybrid memory subsystem.

FIG. 15 is a block diagram of an embodiment of variable partitioning in a hybrid memory subsystem.

A set of registers 1510 or other mechanism may be employed to provide the external system with a capability to configure the volatile memory 102 and/or the nonvolatile memory 104 of the memory subsystem. In some situations the memory subsystem may be "hard wired" for a particular configuration.

The configuration provides that one or more portions 1502 of the volatile memory 102 are supported by backup capacity 1506 of the nonvolatile memory. The external system may read and write data from and to these portions 1502 as if interacting with volatile memory (e.g. using a RAM data/address protocol), but these portions 1502 will be backed up automatically to nonvolatile memory 104 in the event of external system power failure. Hence, these portions 1502 may be considered by the external system to be nonvolatile memory having the speed and usability advantages of volatile memory.

Other portions 1504 of the volatile memory 102 may be used by the external system as standard volatile memory. In other words, the external system may read and write data from and to these portions 1504 as if interacting with volatile memory (e.g. using a RAM data/address protocol), but, like typical volatile memory, these portions 1504 will not be backed up automatically to nonvolatile memory 104 in the event of external system power failure.

Other portions 1508 of nonvolatile memory 104 may be used by the external system as nonvolatile memory. The external system may read and write data to these portions 1508 directly, i.e. via the controller 110 without first writing the data to volatile memory 102 from where it is backed up to nonvolatile memory 104.

Thus, the hybrid memory subsystem may be configured to provide three types of memory to the external system. One type is "nonvolatile" memory 1502 having the interaction advantages (e.g. speed, reusability) of volatile random access memory, and backed up automatically to a portion 1506 of nonvolatile random access memory in the event of system power failure. Another type of memory provided to the external system is standard random access volatile memory 1504. Still another type provided to the external system is standard nonvolatile memory 1508 accessed in a manner native to the nonvolatile memory (block-sequential rather than random accessed).

The portion 1508 of nonvolatile memory that is not reserved for backups of volatile memory 1502 may contain program code or other information and may be "booted" or otherwise loaded into the portion 1504 of volatile memory that is not backed up. Thus, the nonvolatile memory 104 may act as a repository of program code or other "image" information for use by the external system.

Thus, the volatile memory 102 may be partitioned into three logical memory regions: "nonvolatile memory" (1502) which is volatile memory that is backed up to nonvolatile memory in the event of system power failure; volatile memory (1504) which is volatile memory that will not be backed up if system power fails; and volatile memory (also potentially in portion 1504) that will not be backed up if system power fails, but which has a corresponding image in the portion 1508 of nonvolatile memory that is not reserved for backups.

The hybrid memory subsystem may thus include logic to make available to the device into which it is installed at least one portion of the volatile memory that will be backed up to the nonvolatile memory in the event of device power failure. The logic may make available to the device at least one portion of the volatile memory that will not be backed up to the nonvolatile memory in the event of device power failure, and make available to the device at least one portion of the nonvolatile memory that is not reserved for backups from the volatile memory.

The memory subsystem may include one or more configuration registers to enable the device to specify at least one portion of the volatile memory that will be backed up to the nonvolatile memory in the event of device power failure, and to enable the device to specify at least one portion of the nonvolatile memory that is not reserved for backups from the volatile memory.

Those having skill in the art will appreciate that there are various vehicles by which processes and/or systems described herein can be effected (e.g., hardware, software, and/or firmware), and that the preferred vehicle will vary with the context in which the processes are deployed. For example, if an implementer determines that speed and accuracy are paramount, the implementer may opt for a hardware and/or firmware vehicle; alternatively, if flexibility is paramount, the implementer may opt for a solely software implementation; or, yet again alternatively, the implementer may opt for some combination of hardware, software, and/or firmware. Hence, there are several possible vehicles by which the processes described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations may involve optically-oriented hardware, software, and or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood as notorious by those within the art that each function and/or operation within such block diagrams, flowcharts, or examples can be implemented, individually and/or collectively, by a wide range of hardware, software, firmware, or virtually any combination thereof. Several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in standard integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies equally regardless of the particular type of signal bearing media used to actually carry out the distribution. Examples of a signal bearing media include, but are not limited to, the following: recordable type media such as floppy disks, hard disk drives, CD ROMs, digital tape, and computer memory; and transmission type media such as digital and analog communication links using TDM or IP based communication links (e.g., packet links).

In a general sense, those skilled in the art will recognize that the various aspects described herein which can be implemented, individually and/or collectively, by a wide range of hardware, software, firmware, or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment).

Those skilled in the art will recognize that it is common within the art to describe devices and/or processes in the fashion set forth herein, and thereafter use standard engineering practices to integrate such described devices and/or processes into larger systems. That is, at least a portion of the devices and/or processes described herein can be integrated into a network processing system via a reasonable amount of experimentation.

The foregoing described aspects depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

What is claimed is:

1. A memory module comprising:
    a volatile memory;
    a non-volatile memory adapted with at least twice the memory storage capacity of the volatile memory;
    a memory controller adapted to present to a host system external to the memory module an address space exclusively for storage locations in the volatile memory, so that any data stored in the non-volatile memory must first be stored in the volatile memory;
    a primary power supply input adapted to receive power from the host system;
    a backup power source internal to the memory module; and
    logic to copy the contents of the volatile memory to the nonvolatile memory, using power from the backup power source, when suitable power from the host system is unavailable.

2. The memory module of claim 1, further comprising:
    the address space presented to the host system including only addresses in the volatile memory, and no addresses in the memory controller or the nonvolatile memory.

3. A data processing device, comprising:
    a host system including a volatile memory interface to a plug-in memory module;
    the plug-in memory module comprising:
        a volatile memory;
        a non-volatile memory adapted with at least twice the memory storage capacity of the volatile memory;
        a memory controller adapted to present to a host system external to the memory module an address space exclusively for storage locations in the volatile memory, so that any data stored in the non-volatile memory must first be stored in the volatile memory;
        a primary power supply input adapted to receive power from the host system;
        a backup power capacitor internal to the memory module; and
        logic to copy the contents of the volatile memory to the nonvolatile memory, using power from the backup power capacitor, when suitable power from the host system is unavailable.

4. The memory module of claim 1, further comprising:
    the address space presented to the host system including only addresses in the volatile memory, and no addresses in the memory controller or the nonvolatile memory.

* * * * *